United States Patent

Meddles

Patent Number: 4,556,896
Date of Patent: Dec. 3, 1985

[54] LEAD FRAME STRUCTURE

[75] Inventor: Dennis Meddles, Torrance, Calif.

[73] Assignee: International Rectifier Corporation, Los Angeles, Calif.

[21] Appl. No.: 412,928

[22] Filed: Aug. 30, 1982

[51] Int. Cl.⁴ .................. H01L 23/30; H01L 23/12; H01L 23/48

[52] U.S. Cl. ........................ 357/70; 357/72; 357/74; 174/52 FP

[58] Field of Search ............... 357/70, 72, 74; 174/52 FP

[56] References Cited

U.S. PATENT DOCUMENTS

| | | | |
|---|---|---|---|
| 3,950,140 | 4/1976 | Bliven et al. | 357/70 X |
| 4,023,053 | 3/1977 | Shimizu et al. | 357/70 X |
| 4,141,029 | 2/1979 | Dromsky | 357/70 |
| 4,408,218 | 10/1983 | Grabbe | 357/70 |

FOREIGN PATENT DOCUMENTS

| | | | |
|---|---|---|---|
| 2107786 | 7/1978 | Fed. Rep. of Germany | 357/70 |
| 0038974 | 4/1978 | Japan | 357/70 |
| 0055169 | 5/1979 | Japan | 357/70 |
| 0053450 | 4/1980 | Japan | 357/70 |
| 0076542 | 6/1981 | Japan | 29/588 |
| 0094763 | 7/1981 | Japan | 357/70 |

Primary Examiner—Andrew J. James
Assistant Examiner—Sheila V. Clark
Attorney, Agent, or Firm—Ostrolenk, Faber, Gerb & Soffen

[57] ABSTRACT

A novel lead frame structure is provided which contains an integral arrangement of leads for connection to a semiconductor device and a molded housing is then molded around the semiconductor device and the lead frame. The lead elements of the frame are then separated to define a plurality of individual semiconductor devices. The lead frame has an enlarged finger section which receives a semiconductor die. The enlarged lead frame finger has an opening just behind the region which receives the die. This opening as well as all identical openings along the length of the lead strip are then aligned with respective molding gates in one half of a pair of cooperating molding dies so that plastic injected through the gate flows through the opening and upwardly into the mold with the plastic filling the mold cavity from top to bottom while ejecting air from the mold as the mold fills through the clearance opening between the ejector pin and its receiving opening.

13 Claims, 13 Drawing Figures

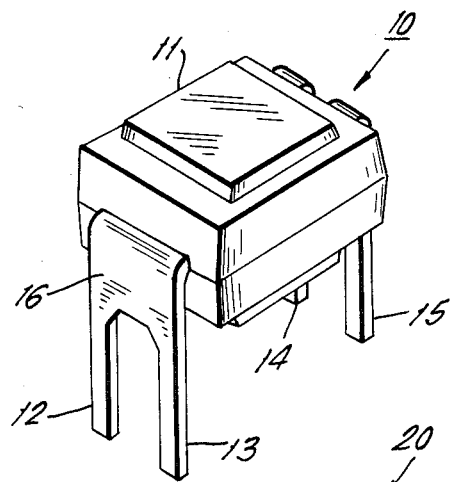
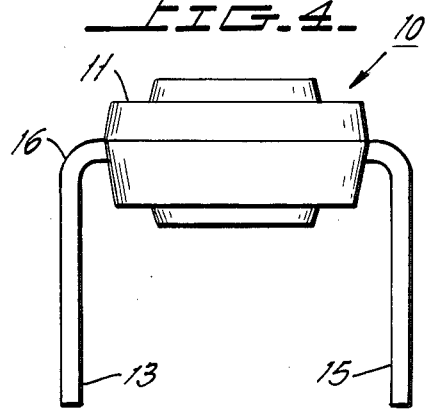
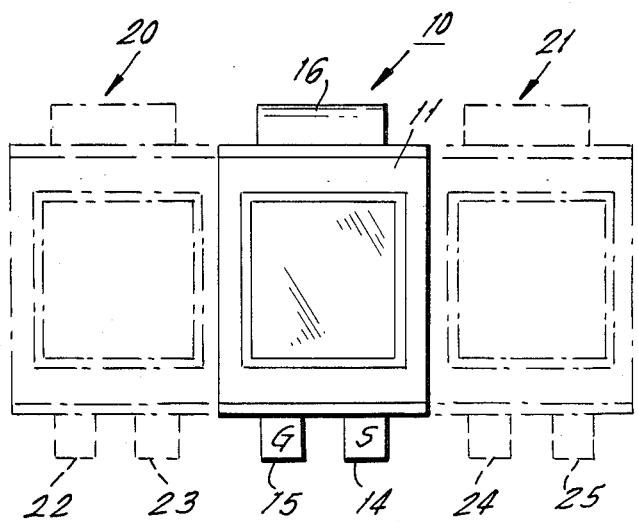
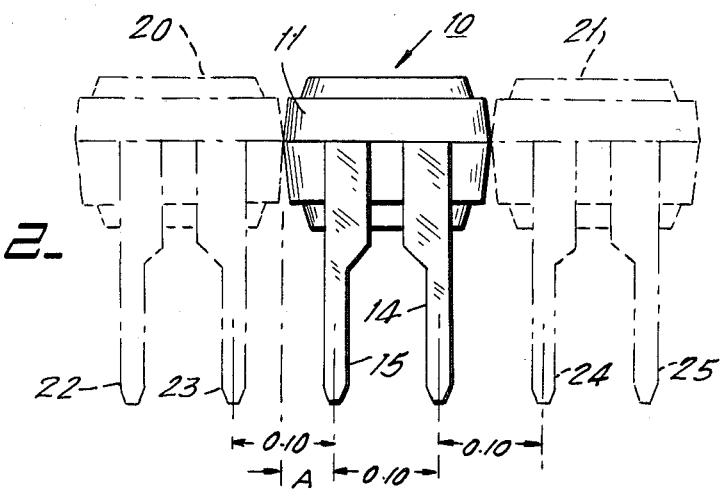

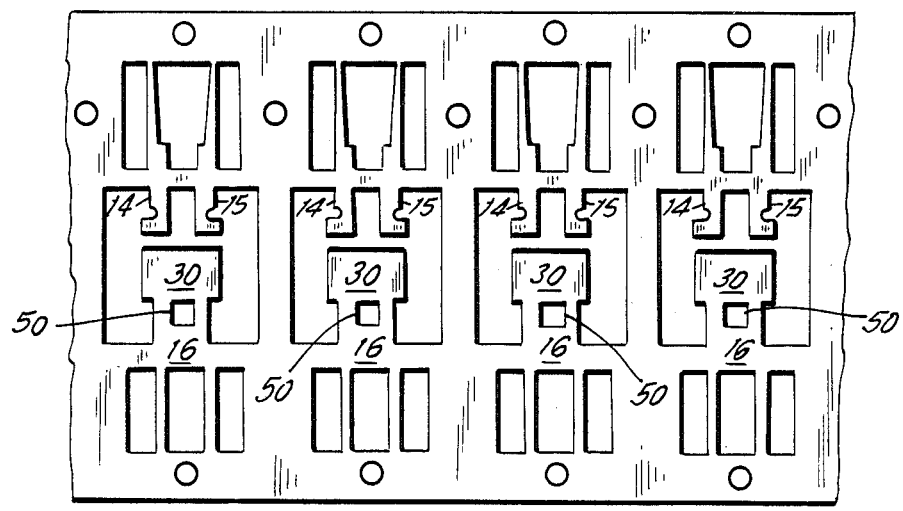
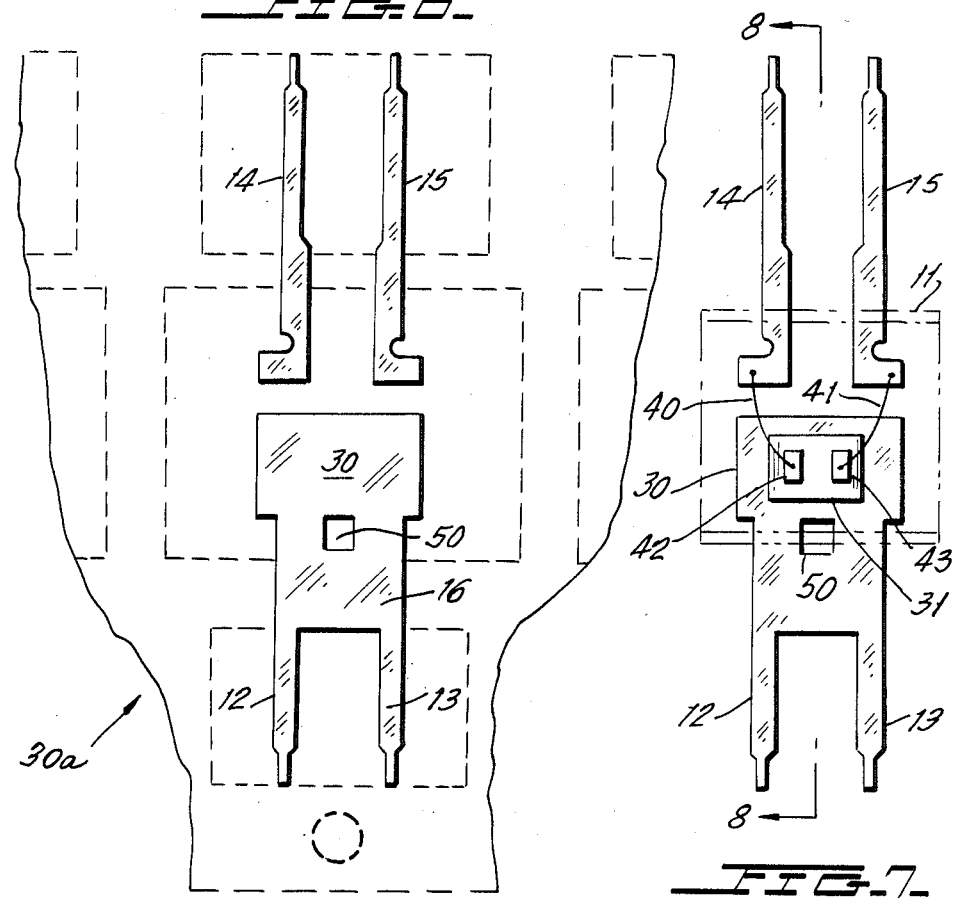

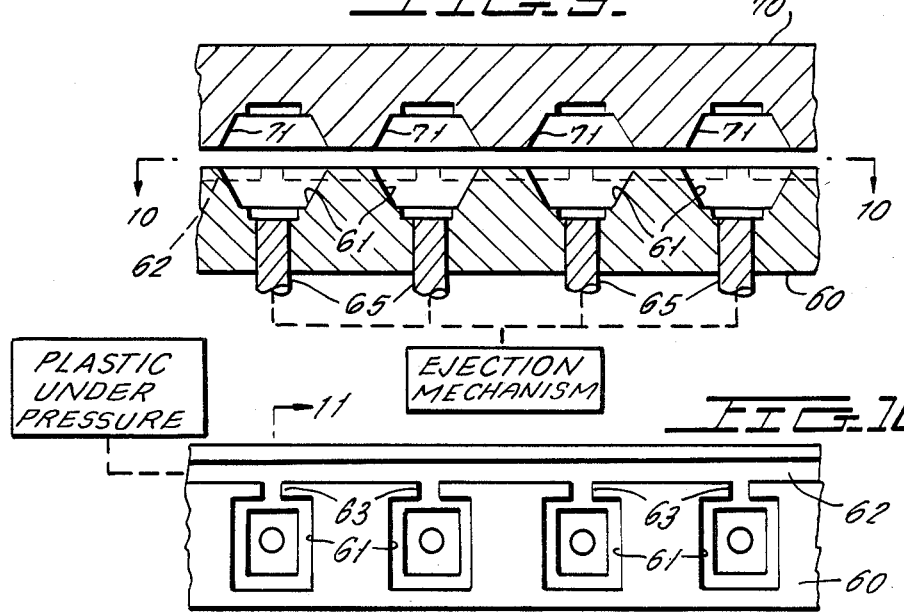
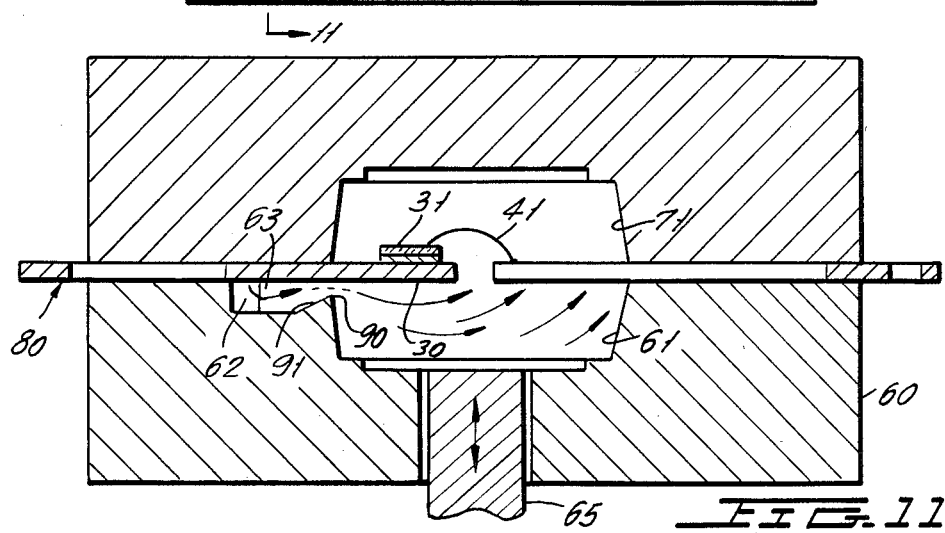
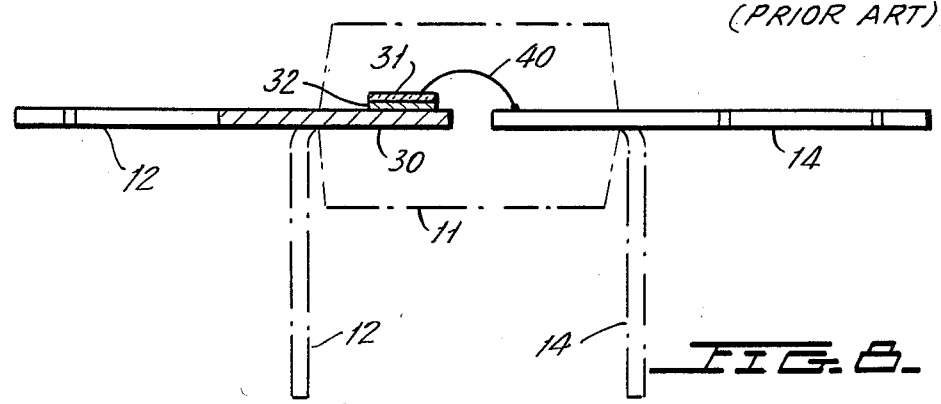

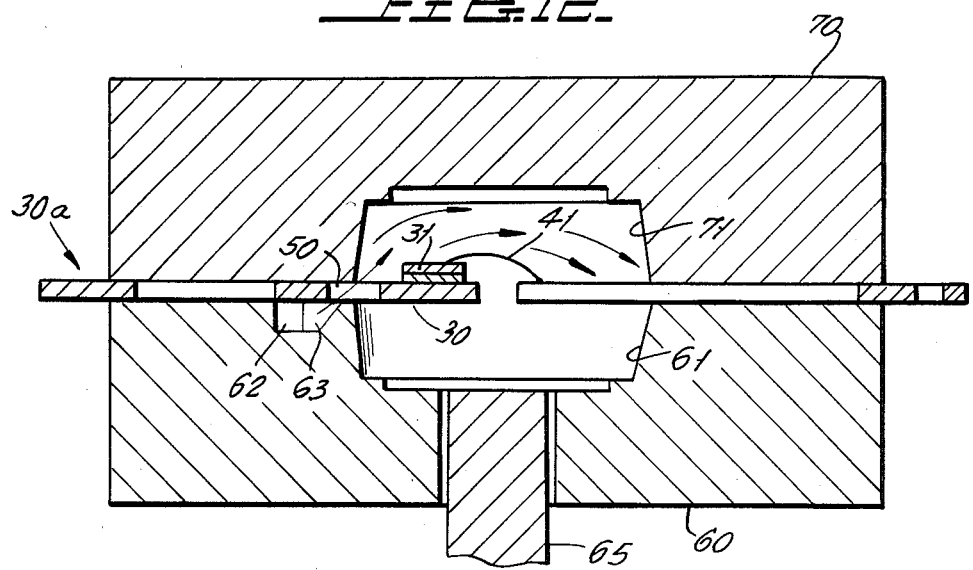
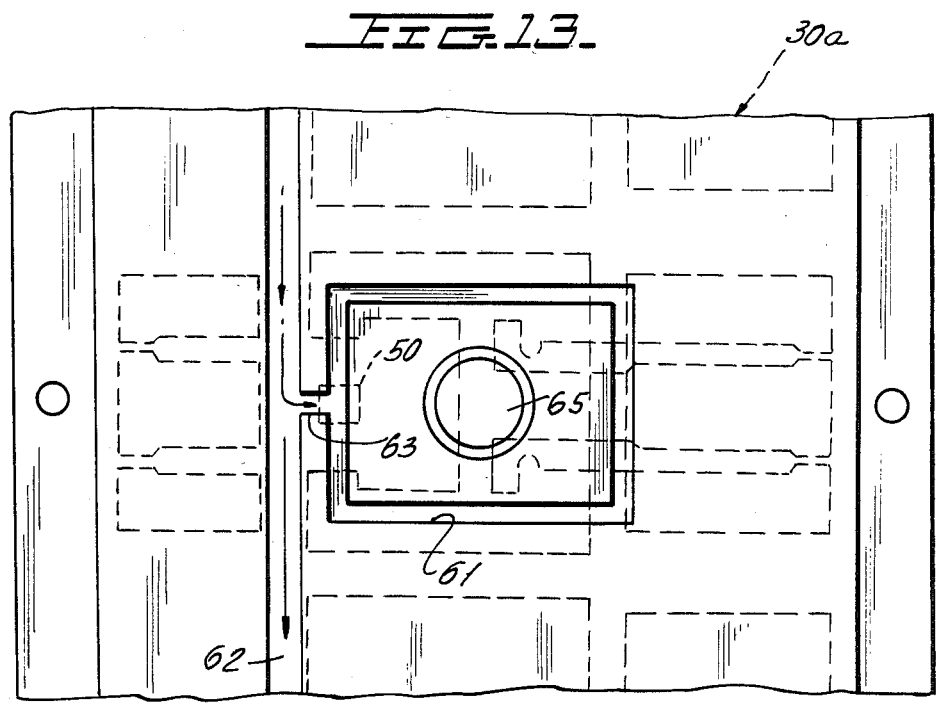

LEAD FRAME STRUCTURE

BACKGROUND OF THE INVENTION

This invention relates to a novel process for molding plastic housings onto a lead frame having a plurality of spaced semiconductor dies connected along its length and to a novel lead frame structure which improves the mold product. More particularly, the invention relates to a novel process and lead frame structure for the manufacture of semiconductor devices of the type shown in co-pending application Ser. No. 251,268, filed Apr. 6, 1981 in the name of Dennis Meddles entitled "Four Leaded Dual In-Line Package Module for Semiconductor Devices".

In order to form a relatively inexpensive package for semiconductor devices, it is common to use an elongated lead frame which has a plurality of identical groups of leads contained integrally within a common conductive strip. Semiconductor chips or dies are then soldered to one lead element of each group of leads along the length of the frame. Other electrical connections are made from the other lead frame elements of each group to the semiconductor chip terminals as desired. The entire lead frame with subassembled chip and wire leads is then placed between the halves of a transfer mold and plastic is injected into the mold cavities to form an encapsulated housing around each semiconductor device and its integral leads. The ends of the lead frame elements extend beyond the edge of the housing to allow electrical connection to the individual package.

The mold halves which are commonly used in this molding operation contain a small gate region. The gate region is an opening into the bottom mold half cavity which is disposed beneath the lead frame and which communicates with a runner which receives molten plastic under pressure which is to be transferred to the mold cavity. The gate region preferably has an area as small as possible so that after molding, the solidified plastic within the runner can be easily broken away from the side of the molded housing. Frequently, however, the gate area is so large that the package edge will chip during the breakout of the package from the runner since the runner is connected to the package over the large gate cross-section. The gate area is frequently large because, when the gate is made too small in area, the molten plastic moves at great speed through the gate as it fills the die cavity. The high-speed movement of the molding compound causes erosion or substantial wear of the gate so that the mold must be rebuilt or replaced frequently in order to restore the gate to a small size.

A further problem with prior art molding techniques is that the plastic entering the gate fills the die cavity from the bottom to the top. The ejector pins for ejecting the die from the completed mold are located within the bottom mold half. Therefore, as plastic is admitted into the bottom half of the mold, the air leakage path which surrounds the ejector pin is quickly closed. As the die fills with molten plastic from bottom to top, air within the mold is captured and is compressed against the top surface of the mold. This captured air frequently produces bubbles or irregularities in the upper surface of the molded part.

Thus, the prior art techniques for molding small plastic semiconductor device packages has a large reject rate, as high as 20 to 30%, due to chipping of the package in the area of the gate; bubbles in the upper surface of the device caused by air which is trapped in the mold cavity as the cavity is filled with plastic; and rapid gate wear due to fast moving plastic through the narrow gate region.

BRIEF DESCRIPTION OF THE INVENTION

In accordance with the present invention, the lead frame structure which is used in the molding operation is provided with intentional openings disposed immediately adjacent the mold activity edge and extending across the edge region of the housing. These openings communicate with a runner which terminates flush on the lower surface of the lead frame. The opening in the lead frame acts as a mold gate which is located remotely from the mold. Plastic from the runner may flow preferably upwardly through the gate opening in the lead frame and into the upper cavity of the cooperating mold halves. Consequently, plastic will fill the interior cavity from top to bottom rather than from bottom to top as in the prior art, and trapped air within the cavity will be ejected from the cavity through the openings surrounding the pin ejector which is located in the bottom cavity. While the gate area is relatively large in cross-section, the runner section attached to the side of the package is relatively small and can be easily snapped off since its size is determined by the width of the gate opening and the thickness of the lead frame. As a result of the invention, plastic enclosures are formed which are free of bubbles; breakout of the package from the runners is very simple and can be accomplished without chipping of the molded housing body; and there is no gate wear problem since the opening in the lead frame is employed as the gate structure. It has been found that when using the present invention, the yield during the molding process was increased to 100%.

BRIEF DESCRIPTION OF THE DRAWINGS

FIG. 1 is a perspective view of a four-lead dual in-line module which can be manufactured in accordance with the present invention.

FIG. 2 is an elevation view of the device of FIG. 1 with adjacent modules shown in phantom lines.

FIG. 3 is a top view of FIG. 2.

FIG. 4 is an end view of FIG. 2.

FIG. 5 is a plan view of a lead frame which contains the novel gate aperture of the invention.

FIG. 6 is a view of one of the elements of the lead frame of FIG. 5 and shows, in dotted lines, those portions of the lead frame which are removed from the frame after the housing is completed.

FIG. 7 shows the elemental lead frame of FIG. 6 with a semiconductor chip and wire leads, and shows the molded housing which encapsulates the assembly in phantom lines.

FIG. 8 is a cross-sectional view of FIG. 7 taken across section line 8—8 in FIG. 7.

FIG. 9 is a cross-sectional view of two mold halves which define between them a cavity for forming the molded housing around the lead frame as shown in FIGS. 5–8.

FIG. 10 is a plan view of the mold openings in the bottom half of the die of FIG. 9 and is a view as seen across section line 10—10 in FIG. 9.

FIG. 11 is a cross-section similar to that of FIG. 9, taken across the section line 11—11 in FIG. 10 and illustrates a prior art type of lead frame with a molding gate in the lower mold half for introducing molten plastic into a die cavity.

FIG. 12 is a cross-sectional view similar to FIG. 11 but illustrates the novel mold gate of the present invention in conjunction with the novel lead frame, wherein the lead frame defines a gate opening to receive molten plastic which is injected into the mold cavity and fills the cavity from top to bottom.

FIG. 13 is a plan view of the interior of the bottom mold shown in FIG. 12 with the lead frame superimposed over the cavity as shown in dotted lines.

DETAILED DESCRIPTION OF THE INVENTION

The present invention provides a novel molding process and lead frame structure for the manufacture of a variety of molded electrical products. By way of example, the invention may be used in the manufacture of a semiconductor device of the type shown in FIGS. 1-4, which is also the device described in copending application Ser. No. 251,268 previously referred to.

The device of FIGS. 1-4 is a modular housing for a semiconductor device and consists of an insulation housing 11 having a total of four leads. Leads 12 and 13 extend from one side of housing 11 and leads 14 and 15 extend from the other side of housing 11 and are in line with leads 12 and 13 respectively. Leads 12 and 13 are connected together and extend from a common conductive region 16 which extends out of the housing 11. Leads 14 and 15 are electrically insulated from one another. Lead 12, lead 13 and combined leads 14 and 15 are three respective severed parts of a common lead frame as will be later described.

Typically, leads 12–15 have a size and spacing adapted to plug into a conventional header socket, with the leads 12 and 13 and leads 14 and 15, respectively, spaced from one another by about 0.100" center to center. The spacing between the ends of leads 13 and 15, when bent as seen in FIG. 4 so that they are parallel to one another, is about 0.300". The height of insulation body 11 may be approximately 0.2". The total width of the insulation housing 11 from end to end is approximately 0.198", with the leads 14 and 15 and the leads 12 and 13 being symmetrically disposed across this width. Consequently, the distance A in FIG. 2 is about one-half the spacing between leads 14 and 15 which is approximately 0.050". As a result of this novel geometry, when identical modules are stacked end to end, as shown in phantom view in FIGS. 2 and 3 for the modules 20 and 21, all adjacent leads including the leads 22 and 23 of module 20, leads 24 and 25 of module 21 and leads 15 and 14 of module 10 will be spaced by an identical distance. The individual modules may be cemented or otherwise secured together to form a dual or quad package which will fit exactly into a standard DIP socket.

FIG. 5 is a plan view of a lead frame 30a which can be employed as the source of the lead frame segments 14, 15 and 16 of FIGS. 1 to 4. While the lead frame 30a of FIG. 5 can have any desired length, the length shown contains four identical lead frame sections. The lead frame 30a of FIG. 5 can be a stamped copper strip having a thickness for example of 15 mils. Other metals, for example, Kovar or steel could also be used for the lead frame 30a. The copper strip may be plated with contact metals or unplated. For example, if aluminum wire bonding is to be used to make electrical connection between semiconductor dies or chips and the wire leads are to be connected to the lead frame elements, the lead frame is preferably silver plated to a thickness of 50–75 microinches. Such a silver plated frame can receive a semiconductor chip by cementing with a silver filled epoxy. The leads which exist when the lead frame elements are cut out of the frame are then silver plated and are therefore easily solderable. It is also possible to use gold plating on the lead frame if gold bonding techniques are to be used.

Each of the individual lead frame elements contains enlarged area finger 30 which extends from common region 16 and which faces the fingers 14 and 15. For clarity, FIG. 6 shows one element of the three lead frame terminals which are cut from the lead frame of FIG. 5 with the remainder of the lead frame shown in dotted lines. The enlarged area finger or pad 30 of each of the elements receives a semiconductor chip such as the chip 31. The semiconductor chip or die 31 can, for example, be a vertical conduction type MOSFET of well known variety, or any other desired semiconductor device. The bottom surface of the chip 31 can be connected to the pad 30 by soldering, using the solder wafer 32 shown in FIG. 8. Alternatively and where the frame 5 is silver plated, a silver filled epoxy can be used to electrically and mechanically connect the chip 31 to the lead frame pad 30.

Each of the pad regions 30 FIG. 5 receives a semiconductor chip or die 31 shown in FIGS. 7 and 8 while the frame is still intact. Thereafter, lead wires shown as lead wires 40 and 41 in FIG. 7 are attached from bonding pad regions 42 and 43 respectively on the chip 31 to the ends of fingers 14 and 15 within the lead frame. With the semiconductor chips and leads now subassembled on the lead frame, the entire lead frame is placed between the halves of a transfer mold in order to form the housing 11 on each of the lead frame elements.

In accordance with the present invention, the lead frame as shown in FIGS. 5, 6 and 8 is provided with a gate opening 50 which is displaced from the die 31 and is located so that it will straddle the side edge of the housing 11.

The transfer molding dies for molding an entire lead frame are partly shown in FIGS. 9 and 10 for four locations corresponding to the four lead frame locations of the lead frame of FIG. 5. Thus, in FIGS. 9 and 10 there is a bottom die 60 made of any suitable metal such as steel which has formed therein a plurality of spaced depressions 61 which define the lower half of the object to be molded therein. Note that the center-to-center spacing of the mold depressions 61 corresponds identically to the center-to-center spacings of the spaced lead frame sections in FIG. 5.

The bottom of the die 60 receives a plurality of movable ejector pins 65 which are movable upwardly and are used to eject molded devices from the lower mold after the plastic has set and the mold is opened.

The lower mold half 60 of FIGS. 9 and 10 is further provided with a runner channel 62 which has short runner sections 63 extending therefrom and into the individual lower cavities 61. The gate configuration whereby runner sections 63 communicate with the cavity will be later described in more detail in connection with FIGS. 11, 12 and 13. A source of plastic under pressure is connected to the runner 62 for injecting plastic into the runners and then into the cavities which are formed between the mold halves. The plastic can for example be a suitable thermosetting epoxy resin having good electrical insulation characteristics. An upper mold half 70 as shown in FIG. 9 contains spaced cavities 71 which form the upper portions of the objects to be molded and are in alignment with respective lower cavities 61.

The two mold halves 60 and 70 close on the lead frame 30a of FIG. 5 in such a manner that the lead frame sections serve as closures for the mold to prevent escape of molten plastic to the exterior of the mold and confine the molten plastic in the cooperating cavities 61 and 71.

FIG. 11 shows the mold gate used with prior art lead frames such as the prior art lead frame 80. Note that the prior art lead frame is not provided with an aperture such as aperture 50 of FIG. 5 disposed behind the pad 30 which carries the semiconductor chip 31. In FIG. 11 the mold gate is formed by the area above the upper edge 90 of upwardly ramped section 91 of the runner 63. The upper boundary of the gate is defined by the solid section of the lead frame pad portion 30 disposed above the upper gate edge 90.

In FIG. 11, when molten plastic is injected through runners 62 and 63, it flows through the gate 90 which is located at the center of an outer edge of the ultimately produced housing 11. Plastic then flows, by gravity, into the bottom of the cavity formed between cavities 61 and 71 and then fills the cavity from bottom to top. A fairly close tolerance exists between the ejector pins 65 and the openings in die 60 which receive the ejector pins 65 so that plastic cannot escape through the gap between pins 65 and the openings which receive them. However, this is the main path for escape of air from the cavity as plastic fills the cavity. This escape path however is quickly sealed by molten plastic which initially settles into the bottom of the cavity 61. Thus, as plastic fills the cavity, air becomes entrapped and compressed toward the top of the cavity area 71. Frequently the entrapped air will produce bubbles in the upper surface of the housing 11 and cause the housing to be rejected. Note that another air escape path exists between the engaging surfaces of the lead frame surface and mold halves, but this does not permit sufficient escape of air trapped in the upper cavity 71.

A further problem experienced with the mold of FIG. 11 involves the cross-sectional area of the gate area. It is desirable that the spacing between gate peak 90 and the bottom of lead frame 80 be as small as possible so that the runner can be easily snapped off from the side of the housing 11 without chipping the housing or causing a rough edge when the mold is completed. However, a reduction of the gate area dimension also reduces the effective gate area through which all plastic must flow. Thus the rate of flow of plastic through the gate becomes extremely high when the gate is very small. This then causes rapid erosion of the gate and requires frequent repair or replacement of the mold member.

FIGS. 12 and 13 show the manner in which the novel lead frame of the invention can be employed to simplify the mold and to produce molded parts with extremely high yield. Thus, in FIG. 12 it is seen that the lead frame 30a of the invention is mounted with the opening 50 in the lead frame straddling the lateral edge of cavity 61. Moreover, in the gate region of runner 63, the runner comes completely up to the bottom surface of the lead frame 30a and is flush with the top of mold half 60. When the mold is closed, the opening 50 acts as the mold gate for introducing plastic into the cavity 61-71. This opening can be as large as desired since the runner portion to be broken off from the side of the housing 11 is defined by the thickness of the lead frame and not by the gate opening.

Moreover, the use of the opening 50 in combination with a runner 63 in the bottom half of the mold causes injection of plastic into the top of the mold as shown by the arrows so that the mold cavity fills from top to bottom rather than from bottom to top as in FIG. 11. Consequently, trapped air within the mold, as the mold fills from top to bottom, will be driven downwardly and will escape from the mold cavity through the space between the ejector pins 65 and the openings which receive them.

Therefore, parts which have been molded in accordance with the invention are free of entrapped air bubbles and do not suffer from chips or cracks when breaking the runner off the main housing body. Finally, the mold halves are very sturdy and do not have gate regions which can be eroded by rapid flow of plastic.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A lead frame for a semiconductor device; said lead frame comprising a flat elongated metal strip having a plurality of identical stamped lead assembly sections disposed along the length of said strip; each of said lead assembly sections including an enlarged pad section and at least first and second lead sections, each of said enlarged pad sections and said first and second lead sections being integral parts of said strip and being joined together within said strip by regions which are severable in order to permit electrical isolation of said pad section and said first and second lead sections from one another; each of said enlarged pad sections having an upper surface area for electrically and thermally receiving one surface of a semiconductor chip; each of said first and second lead sections having free ends which define wire-receiving areas for receiving electrical leads which are to be connected to the surface of respective ones of said semiconductor chips which is opposite to its said one surface; and a respective single molding gate opening of sufficient size to enable injection of plastic therethrough extending through each of said enlarged pad sections at a location laterally removed from their said chip-receiving upper surface areas; each of said molding gate openings being located at a region which spans an edge of respective plastic housings which are to be molded onto said lead frame.

2. The lead frame of claim 1 wherein each of said first and second lead sections are coextensive with one another and wherein said enlarged pad sections are disposed adjacent to, but are spaced from free ends of corresponding pairs of said first and second lead sections.

3. The lead frame of claim 1 or 2 wherein each of said enlarged pad sections have reduced width lead means extending therefrom in a direction away from respective pairs of said first and second lead sections.

4. The lead frame of claim 3, wherein each of said reduced width lead means comprises third and fourth spaced lead sections which are parallel to one another and are disposed in-line with said first and second lead sections respectively; said molding gate openings being located symmetrically across a line which is parallel to and centered between said third and fourth lead sections.

5. The lead frame of claim 1 or 2, wherein each of said molding gate openings are located symmetrically across a line which is parallel to and centered between their respective said first and second lead sections.

6. The lead frame of claim 1, wherein said strip is of copper.

7. The lead frame of claim 6, wherein said strip is plated with relatively highly conductive solderable metal.

8. The lead frame of claim 4, wherein said strip is of copper.

9. A lead frame assembly for a plurality of semiconductor devices which permits improved moldings of housings for each of said devices; said lead frame assembly including a plurality of semiconductor chips, a plurality of small wire leads for each of said semiconductor chips, and a flat elongated metal lead frame strip having a plurality of identical stamped lead assembly sections disposed along the length of said strip; each of said lead assembly sections including an enlarged pad section and at least first and second lead sections, each of said enlarged pad sections and said first and second lead sections being integral parts of said strip and being joined together within said strip by regions which are severable in order to permit electrical isolation of said pad sections and said first and second lead sections from one another; each of said enlarged pad sections having an upper surface which electrically and thermally receives a respective one of said semiconductor chips; each of said first and second lead sections having free ends which define wire lead receiving areas for receiving one of the ends of respective ones of said small wire leads; the other of the ends of said small wire leads connected to the surface of their respective semiconductor chip which is opposite to its said one surface; and a respective single molding gate opening extending through each of said enlarged pad sections at locations laterally removed from their said chip-receiving upper surface areas; said molding gate openings being located at a region which spans an edge of respective plastic housings which are molded onto said lead frame assembly.

10. The assembly of claim 9, wherein each of said first and second lead sections are coextensive with one another and wherein said enlarged pad sections are diposed adjacent, but are spaced from free ends of corresponding pairs of said first and second lead sections.

11. The assembly of claim 9 or 10, wherein each of said enlarged pad sections have reduced width lead means extending therefrom in a direction away from respective pairs of said first and second lead sections.

12. The assembly of claim 11, wherein each of said reduced width lead means comprises third and fourth spaced lead sections which are parallel to one another and are disposed in-line with said first and second lead sections respectively; said molding gate openings being located symmetrically across a line which is parallel to and centered between said third and fourth lead sections.

13. The assembly of claim 9 or 10, wherein each of said molding gate openings are located symmetrically across a line which is parallel to and centered between their respective said first and second lead sections.

* * * * *